(12) United States Patent
Clark et al.

(10) Patent No.: US 11,209,543 B2
(45) Date of Patent: Dec. 28, 2021

(54) SONAR TRANSDUCER HAVING ELECTROMAGNETIC SHIELDING

(71) Applicant: NAVICO HOLDING AS, Egersund (NO)

(72) Inventors: Jeremiah Clark, Tulsa, OK (US); Alan Islas Cital, Tulsa, OK (US); Wei Sun, Tulsa, OK (US)

(73) Assignee: NAVICO HOLDING AS, Egersund (NO)

( * ) Notice: Subject to any disclaimer, the term of this patent is extended or adjusted under 35 U.S.C. 154(b) by 564 days.

(21) Appl. No.: 16/175,188

(22) Filed: Oct. 30, 2018

(65) Prior Publication Data

US 2019/0064348 A1    Feb. 28, 2019

Related U.S. Application Data

(63) Continuation-in-part of application No. 15/214,968, filed on Jul. 20, 2016, now Pat. No. 10,597,130,
(Continued)

(51) Int. Cl.
*G01S 15/89* (2006.01)
*G01S 15/96* (2006.01)
(Continued)

(52) U.S. Cl.
CPC ........ *G01S 15/8902* (2013.01); *B63H 20/007* (2013.01); *B63H 20/32* (2013.01);
(Continued)

(58) Field of Classification Search
CPC ...... G01S 15/8902; G01S 15/89; G01S 15/96; G10K 11/346; G10K 11/008;
(Continued)

(56) References Cited

U.S. PATENT DOCUMENTS

| 4,737,940 A | 4/1988 | Arringotn |
| 4,939,700 A | 7/1990 | Breton |

(Continued)

FOREIGN PATENT DOCUMENTS

| GB | 2294763 A | 5/1996 |
| JP | 01-118791 A | 5/1989 |

(Continued)

OTHER PUBLICATIONS

Christophe Sintes, et al.; Interferometric Side Scan Sonar: A Tool for High Resolution Sea Floor Exploration; Technical Lessons Learnt from the Erika Incident and Other Oil Spills, Brest, Mar. 13-16, 2002; pp. 1-15.

(Continued)

*Primary Examiner* — Daniel Pihulic
(74) *Attorney, Agent, or Firm* — Nelson Mullins Riley & Scarborough LLP

(57) ABSTRACT

A sonar transducer assembly is provided including a transducer configured to transmit one or more sonar beams into an underwater environment, a housing that holds the transducer, at least one electrical cable that enables electrical signals to be transmitted between the transducer and a computing device, and a conductive enclosure disposed around at least a portion of the transducer and electrically connected to a ground line of the electrical cable to create a shielded volume. The conductive enclosure reduces an electromagnetic field within the shielded volume.

11 Claims, 8 Drawing Sheets

Related U.S. Application Data which is a continuation-in-part of application No. 14/598,122, filed on Jan. 15, 2015, now abandoned.

(51) Int. Cl.
*G10K 11/00* (2006.01)
*B63H 20/00* (2006.01)
*B63H 20/32* (2006.01)
*H05K 9/00* (2006.01)
*G10K 11/34* (2006.01)

(52) U.S. Cl.
CPC .............. *G01S 15/89* (2013.01); *G01S 15/96* (2013.01); *G10K 11/008* (2013.01); *G10K 11/346* (2013.01); *H05K 9/0084* (2013.01); *G10K 2200/10* (2013.01); *G10K 2200/11* (2013.01)

(58) Field of Classification Search
CPC ........... G10K 2200/10; G10K 2200/11; B63H 20/32; B63H 20/007; H05K 9/0084
See application file for complete search history.

(56) References Cited

U.S. PATENT DOCUMENTS

| | | | |
|---|---|---|---|
| 4,970,700 | A | 11/1990 | Gilmour et al. |
| 5,077,699 | A | 12/1991 | Passamante et al. |
| 5,184,330 | A | 2/1993 | Adams et al. |
| 5,200,931 | A | 4/1993 | Kosalos et al. |
| 5,260,912 | A | 11/1993 | Latham |
| 5,525,081 | A | 6/1996 | Mardesich |
| 5,530,680 | A | 6/1996 | Whitehurst |
| 5,537,380 | A | 7/1996 | Sprankle et al. |
| 5,568,152 | A | 10/1996 | Janky et al. |
| 5,675,552 | A | 10/1997 | Hicks et al. |
| 5,793,703 | A | 8/1998 | Shippey |
| 5,805,528 | A | 9/1998 | Hamada et al. |
| 5,812,494 | A | 9/1998 | Medeiros |
| 5,923,617 | A | 7/1999 | Thompson et al. |
| 6,160,764 | A | 12/2000 | Powell |
| 6,449,215 | B1 | 9/2002 | Shell |
| 6,652,331 | B2 | 11/2003 | Healey |
| 6,909,946 | B1 | 6/2005 | Kabel et al. |
| 6,995,527 | B2 | 2/2006 | DePasqua |
| 7,113,449 | B2 | 9/2006 | Fairbairn |
| 7,369,459 | B2 | 5/2008 | Kawabata et al. |
| 7,542,376 | B1 | 6/2009 | Thompson et al. |
| 7,579,954 | B1* | 8/2009 | Burkley ............... A45C 11/182 235/441 |
| 7,606,114 | B2 | 10/2009 | Bachelor et al. |
| 7,652,952 | B2 | 1/2010 | Betts et al. |
| 7,729,203 | B2 | 6/2010 | Betts et al. |
| 7,755,974 | B2 | 7/2010 | Betts et al. |
| 7,889,600 | B2 | 2/2011 | Thompson et al. |
| 8,295,393 | B2 | 10/2012 | Wantanabe et al. |
| 8,300,499 | B2 | 10/2012 | Coleman et al. |
| 8,305,840 | B2 | 11/2012 | Maguire |
| 8,305,844 | B2 | 11/2012 | DePasqua |
| 8,486,968 | B2 | 7/2013 | Priepke et al. |
| 8,514,658 | B2 | 8/2013 | Maguire |
| 8,605,550 | B2 | 12/2013 | Maguire |
| 8,711,140 | B1 | 4/2014 | Mallet |
| 8,717,847 | B2 | 5/2014 | Blake |
| 8,767,509 | B2 | 7/2014 | Freking et al. |
| 8,879,359 | B2 | 11/2014 | DePasqua |
| 8,953,647 | B1 | 2/2015 | Mead et al. |
| 9,201,142 | B2 | 12/2015 | Antao |
| 9,335,412 | B2 | 5/2016 | Proctor |
| 9,405,028 | B2 | 8/2016 | Bloor |
| 9,495,764 | B1 | 11/2016 | Boardman et al. |
| 9,664,783 | B2 | 5/2017 | Brown et al. |
| 9,766,328 | B2 | 9/2017 | Black et al. |
| 9,784,825 | B2 | 10/2017 | Brown et al. |
| 9,784,826 | B2 | 10/2017 | Matson et al. |
| 9,812,118 | B2 | 11/2017 | Matson et al. |
| 2002/0013106 | A1* | 1/2002 | Healey .................. G01S 7/521 440/6 |
| 2002/0044500 | A1* | 4/2002 | Hansen .................. G01S 15/88 367/173 |
| 2002/0071345 | A1 | 6/2002 | Chiang et al. |
| 2002/0126576 | A1 | 9/2002 | Douma et al. |
| 2002/0188200 | A1 | 12/2002 | Mauchamp et al. |
| 2003/0081503 | A1 | 5/2003 | Barnard et al. |
| 2003/0235112 | A1 | 12/2003 | Zimmerman et al. |
| 2005/0007880 | A1 | 1/2005 | Zimmerman et al. |
| 2005/0036404 | A1 | 2/2005 | Zhu et al. |
| 2005/0093859 | A1 | 5/2005 | Sumanaweera et al. |
| 2005/0099892 | A1 | 5/2005 | Greelish |
| 2005/0101867 | A1 | 5/2005 | Johnson et al. |
| 2005/0270901 | A1 | 12/2005 | Swanson |
| 2006/0186889 | A1 | 8/2006 | Andreis |
| 2007/0025183 | A1 | 2/2007 | Zimmerman et al. |
| 2007/0159922 | A1 | 7/2007 | Zimmerman et al. |
| 2007/0223306 | A1 | 9/2007 | Toennessen |
| 2007/0223307 | A1 | 9/2007 | Storteig |
| 2007/0291589 | A1 | 12/2007 | Kawabata et al. |
| 2008/0080308 | A1 | 4/2008 | Hornby |
| 2008/0239870 | A1 | 10/2008 | Dubuis et al. |
| 2009/0052277 | A1 | 2/2009 | Swanson |
| 2009/0073804 | A1 | 3/2009 | Laws et al. |
| 2009/0103595 | A1 | 4/2009 | Watanabe et al. |
| 2009/0147623 | A1 | 6/2009 | Betts et al. |
| 2010/0014386 | A1 | 1/2010 | Thompson et al. |
| 2010/0103775 | A1 | 4/2010 | Betts et al. |
| 2011/0013484 | A1 | 1/2011 | Coleman et al. |
| 2011/0013485 | A1 | 1/2011 | Maguire |
| 2011/0038227 | A1 | 2/2011 | Rostov |
| 2011/0128162 | A1 | 6/2011 | Klepsvik |
| 2012/0014220 | A1 | 1/2012 | DePasqua |
| 2012/0099395 | A1 | 4/2012 | Debrunner et al. |
| 2012/0106299 | A1 | 5/2012 | Rowe et al. |
| 2012/0195471 | A1 | 8/2012 | Newcombe et al. |
| 2012/0309755 | A1 | 12/2012 | Priepke et al. |
| 2013/0044569 | A1 | 2/2013 | DePasqua |
| 2013/0148471 | A1 | 6/2013 | Brown et al. |
| 2013/0173163 | A1 | 7/2013 | Zhandov et al. |
| 2013/0208568 | A1 | 8/2013 | Coleman |
| 2013/0215719 | A1 | 8/2013 | Betts et al. |
| 2013/0242700 | A1 | 9/2013 | Blake |
| 2014/0010048 | A1 | 1/2014 | Proctor |
| 2014/0010049 | A1 | 1/2014 | Proctor |
| 2014/0200815 | A1 | 7/2014 | Hung et al. |
| 2014/0269192 | A1 | 9/2014 | Proctor |
| 2015/0003689 | A1 | 1/2015 | Sheiman et al. |
| 2015/0066450 | A1 | 3/2015 | Charlesworth et al. |
| 2015/0078123 | A1 | 3/2015 | Batcheller |
| 2015/0097838 | A1 | 4/2015 | Steward et al. |
| 2015/0130797 | A1 | 5/2015 | Chen et al. |
| 2015/0294660 | A1 | 10/2015 | Stokes et al. |
| 2015/0325043 | A1 | 11/2015 | Bromley et al. |
| 2015/0355373 | A1 | 12/2015 | Zhuo et al. |
| 2016/0003008 | A1 | 1/2016 | Uribe et al. |
| 2016/0011310 | A1 | 1/2016 | Horner et al. |
| 2016/0104359 | A1 | 4/2016 | AlMahmoud |
| 2016/0123499 | A1 | 5/2016 | Lewis |
| 2016/0207602 | A1 | 7/2016 | Clark |
| 2016/0232884 | A1 | 8/2016 | Parks |
| 2016/0259053 | A1 | 9/2016 | Proctor et al. |
| 2016/0320474 | A1 | 11/2016 | Proctor et al. |
| 2016/0325814 | A1 | 11/2016 | Clark et al. |
| 2016/0341827 | A1 | 11/2016 | Horner et al. |
| 2016/0377716 | A1 | 12/2016 | Proctor et al. |
| 2017/0123062 | A1 | 5/2017 | Coleman et al. |
| 2017/0212230 | A1 | 7/2017 | Wigh et al. |
| 2018/0281914 | A1 | 10/2018 | Burton et al. |
| 2018/0314349 | A1* | 11/2018 | Jiang ..................... H02J 50/05 |

FOREIGN PATENT DOCUMENTS

| | | | |
|---|---|---|---|
| JP | | 01-216288 A | 8/1989 |
| JP | | 11-153667 A | 6/1999 |
| JP | | 2008-508539 A | 3/2008 |
| JP | | 2009-068881 A | 4/2009 |

(56) References Cited

FOREIGN PATENT DOCUMENTS

| WO | WO 2003/001231 A2 | 1/2003 |
|---|---|---|
| WO | WO 2006/017511 A2 | 2/2006 |
| WO | WO 2011/008430 A1 | 1/2011 |

OTHER PUBLICATIONS

DePasqua; Humminbird 360 Degree Sonar, <https://www.youtube.com/watch?v=VetZhhulQ0Y>, Feb. 26, 2012.
European Search Report for European Application No. EP 16158998 dated Jul. 20, 2016.
Simrad; ForwardScan® Transducer [online] [Retrieved Mar. 25, 2015]. Retrieved from <URL:http://www.simrad-yachting.com/en-GB/Products/Echosounders/Transducers/ForwardScan-Transducer-en-gb.aspx> . 3 pages.
Furuno; Full-Circle Scanning Sonar FSV-30, [online] [retrieved Apr. 18, 2013] Retrieved from the Internet: <URL: http://www.furuno.com/en/business-product/detail/marine/index.php?prdcd=FSV-30&category=sonar&business=fishing>.
Furuno CH-28 360° Scanning Sonar, 8 pages.
Furuno, Operator's Manual, Color Searchlight Sonar; Model CH-28; Furuno Electric Co., Ltd.; Nishinomiya, Japan; First Edition Jan. 1991; 44 pages.
Gerard Llort-Pujol et al., "A New Approach for Fast and High-Resolution Interfometric Bathymetry", IEEE Oceanic Engineering Society Newsletter, Summer 2006, pp. 12-19.
Giardina; Interferometric Synthetic Aperture Sonar Signal Processing for Autonomous Underwater Vehicles Operating Shallow Water; University of New Orleans Theses and Dissertations; Dec. 15, 2012; Retrieved from the Internet: URL:http://scholarworks.uno.edu/cgi/viewcontent.cgi?article=2587&context=td (retrieved on Jul. 7, 2016).
H. Koyama et al., "Bathymetry by new designed interferometry sonar mounted on AUV", Oceans 2004, MTS/IEEE Techno-Ocean Mar. 14, 2005; pp. 1169-1174.
H.D. Griffiths, et al.; Interferometric Synthetic Aperture Sonar for High-Resolution 3-D Mapping of the Seabed; IEE Proceedings—Radar, Sonar and Navigation; vol. 144, No. 2; Apr. 1997; pp. 96-103.
Humminbird, "Trolling Motor Mounted Transducer", ® 2013 Johnson Outdoors Marine Electronics, Inc.; pp. 1-4.
International Search Report and Written Opinion from International Application No. PCT/US2014/023984, dated Sep. 1, 2014.
ITC Application Equations for Underwater Sound Transducers, International Transducer Corporation (1995) Rev. 8/00, 3 pages.
NOAA; Office of Coast Survey; Phase Dfferencing Bathymetric Sonar [online] [Retrieved May 5, 2015]. Retrieved from the Internet: . 2 pages.
Office Action for Japanese Application No. 2014-051465 dated Jul. 27, 2015.
Office Action for Japanese Application No. 2014-051465 dated Mar. 2, 2016.
Office Action from Japanese Patent Application No. 2014-051465 dated Feb. 23, 2015.
Roy Edgar Hansen, et al.; Signal Processing for AUV Based Interferometric Synthetic Aperture Sonar; Oceans 2003, MTS/IEEE Proceedings Celebrating the Past, Teaming Toward the Future; San Diego, CA; Sep. 22-26, 2003; Oceans MTS/IEEE Conference Proceedings, Columbia, MD; Marine Techn. Soc., Sep. 22, 2003; pp. 2438-2444.
Second Written Opinion of the International Preliminary Examining Authority from International Application No. PCT/US2014/023984, dated Mar. 5, 2015.
Simrad Introduces Forwardscan [online] [retrieved Nov. 25, 2014]. Retrieved from the Internet: <URL: http://www.simrad-yachting.com/en-US/Pressreleases/2014/Simrad-Introduces-Forwardscan/>. (dated Feb. 25, 2014) 2 pages.
Hiller, Tom; "Solving the Interferometric Processing Bottleneck" [online] [Retrieved May 5, 2015]. Retrieved from the Internet: <URL: http://www.oicinc.com/Hiller-Solving-Interferometric-Bottleneck.pdf>. 3 pages.
Woods Holde Coastal and Marine Science Center; "Swath Bathymetry System" [online] [Retrieved May 5, 2015]. Retrieved from the Internet: URL:http://woodshole.er.usgs.gov/operations/sfmapping/swath.htm. 2 pages.
WiseGeek, http://www.wisegeek.com/what-is-3d-imaging.htm (2009).
Bottom Line Fishin' Buddy 2255 Manual.
Bottom Line Fishin' Buddy product literature; Feb. 2001.
Botton Line fishin' Buddy Product Literature; Jul. 14, 1999.
Caputi; Power to the People (4 Look Ahead, Interphase iScan 180); Saltwater Sportsman; Sep. 21, 2007; http://www.saltwatersportsman.com/power-people.
D'Amico, et al.; A Brief History of Active Sonar; Aquatic Mammals; vol. 35, No. 4; pp. 426-434; 2009; http://csi.whoi.edu/sites/default/files/literature/Full%20Text.pdf.
Furuno Model CH-18 Color Searchlight Sonar Product Literature; Feb. 18, 1989.
Furuno Model CH-28 Installation Manual; Apr. 10, 1998.
Furuno Model CH-28 Operator's Manual; Dec. 28, 1996.
Furuno Model CH-28 Product Literature.
Furuno Model CH-37BB Color Sector Scanning Sonar product literature; Jan. 2012.
Humminbird 360 Imaging advertising literature excerpts; pp. 10-11 and 52-53.
Interphase Sea Scout Product Literature; 1994.
Wesmar SS395 Series Sonar Product literature; Feb. 2010; http://www.wesmar.com/productbrochures/wesmar_ss395_web.pdf.
Wesmar SS90B High Frequency Scanning Sonar Product Literature and Wesmar Pricing Information; Mar. 1, 1980.

* cited by examiner

| | A | B | C | D |
|---|---|---|---|---|
| | Base line as reference (without powering on Trolling motor) | Trolling Motor power on but not running | Trolling motor Running at Low speed | Trolling motor Running from low speed to high speed |
| Non-shield transducer 1 | | | | |
| Shielded transducer 2 | | | | |

FIG. 5A

|  | A<br>Base line as reference (without powering on Trolling motor) | B<br>Trolling Motor power on but not running | C<br>Trolling motor Running at Low speed | D<br>Trolling motor Running from low speed to high speed |
|---|---|---|---|---|
| Non-shield transducer 1 | | | | |
| Shielded transducer 2 | | | | |

*FIG. 5B*

SONAR TRANSDUCER HAVING ELECTROMAGNETIC SHIELDING

CROSS REFERENCE TO RELATED APPLICATION

This application claims priority to and is a continuation-in-part of U.S. patent application Ser. No. 15/214,968, entitled "Trolling Motor with a Transducer Array," filed Jul. 20, 2016; which claims priority to and is a continuation-in-part of U.S. patent application Ser. No. 14/598,122, entitled "Nosecone Transducer Array," filed Jan. 15, 2015; each of which is incorporated by reference herein in its entirety.

BACKGROUND

This section is intended to provide information to facilitate an understanding of various technologies described herein. As the section's title implies, this is a discussion of related art. That such art is related in no way implies that it is prior art. The related art may or may not be prior art. It should therefore be understood that the statements in this section are to be read in this light, and not as admissions of prior art.

When trolling for fish, a secondary motor may be used as means of propulsion for trolling purposes. Typically, a trolling motor is a self-contained device coupled to an angler's watercraft and is useful for precise positioning in a body of water.

One or more sonar transducers or transducer arrays may be utilized to identify fish or underwater obstacles in an underwater marine environment. In some cases, the sonar transducers are coupled to the hull of the watercraft and/or the trolling motor.

SUMMARY

Described herein are implementations of various technologies for a trolling motor including a transducer assembly. In one implementation, a device may include a motor, a propeller coupled to the motor, and a shaft configured to couple the motor to a watercraft. The device may include a housing including a nosecone. The housing may encapsulate the motor and transducer array or the transducer assembly may be incorporated within the nosecone.

Described herein are also implementations of various technologies for a trolling motor. In one implementation, a trolling motor may include an electric motor having a propeller coupled thereto and a steering shaft configured for coupling the electric motor to a watercraft. The trolling motor may include a housing encapsulating the electric motor. A sonar transducer assembly may be disposed within the housing, coupled to an external surface of the housing, or otherwise disposed on or coupled to the watercraft.

During operation of the electric motor, a magnetic field is generated to cause the propeller to spin at the desired rate to propel the watercraft at a desired speed and/or in a desired direction. However, the magnetic field may also cause electromagnetic interference (EMI) in electronic circuits in proximity to the electric motor and/or the electromagnetic field produced by the motor. For example, sonar transducer arrays may experience EMI depending of the operating frequency of the transducer array and/or the strength of the magnetic field.

In an example embodiment, a transducer assembly may be provided with a conductive enclosure, e.g. a Faraday cage or shield, disposed about at least a portion of the transducer. The Faraday cage may be electrically connected to an electrical ground line. The Faraday cage may be configured to develop an electrical charge in response to the electromagnetic field produced by the motor. The electrical charge may be shunted to ground by the ground line. Since the electromagnetic field interacts with the Faraday cage, a shielded volume is created within the Faraday cage, thus preventing or limiting the EMI on the transducer array.

The conductive enclosure may be formed from any of a variety of conductive materials, including, but not limited to, metal foil, metal mesh, sheet metal, metal foam, metal ink, or the like. The conductive enclosure may be flexible, such that it is formable around the transducer array. In an example embodiment, the conductive enclosure may include an adhesive on at least one side configured to attach the conductive enclosure to the transducer array. Additionally or alternatively, the conductive enclosure may be a metal particulate applied to, or impregnated within, the housing.

In some example embodiments, the conductive enclosure may cover all or a majority of the transducer assembly. In an example embodiment, the conductive enclosure may include an opening disposed at an emitting face of the transducer assembly.

Although discussed in the context of EMI produced by operation of a trolling motor, the Faraday cage may be employed to minimize EMI from any EMI producing device that may operate proximate to the transducer assembly.

In an example embodiment, a device is provided including a motor, a propeller coupled to the motor, and a shaft configured to couple the motor to a watercraft. The shaft is configured to rotate relative to the watercraft, wherein the shaft defines an internal passage. The device also includes a transducer configured to transmit one or more sonar beams into an underwater environment, a housing that holds the motor and the transducer, and at least one electrical cable that leads from the transducer through the internal passage of the shaft to enable electrical signals to be transmitted between the transducer and a computing device. The electrical cable is contained within the internal passage of the shaft so as to protect the electrical cable while still enabling rotation of the shaft and housing. The device also includes a conductive enclosure disposed around at least a portion of the transducer and positioned between the transducer and the motor. The conductive enclosure is electrically connected to a ground line of the electrical cable to create a shielded volume, such that the conductive enclosure reduces an electromagnetic field within the shielded volume.

In some example embodiments, the housing includes a nosecone, and wherein the transducer is disposed in the nosecone.

In some example embodiments, the motor includes an electric motor and the electric motor is configured to drive the propeller to provide thrust for the watercraft in a body of water during operation of the electric motor.

In some example embodiments, the housing encloses the motor and the transducer within a waterproof capsule impervious to water.

In some example embodiments, the conductive enclosure includes one of a metal foil, sheet metal, metal foam, and metallic ink.

In some example embodiments, the conductive enclosure includes a metal particulate. In some example embodiments, the metal particulate is applied to a surface of the housing. In some example embodiments, the housing is impregnated with the metal particulate.

In some example embodiments, the at least one electrical cable includes a shielded electrical cable.

In some example embodiments, the conductive enclosure includes copper or nickel.

Additional example embodiments of the present invention include apparatuses, methods, systems, and computer program products associated with various embodiments described herein, including, for example, the above described device embodiments.

BRIEF DESCRIPTION OF THE DRAWINGS

Implementations of various techniques are described herein with reference to the accompanying drawings. It should be understood, however, that the accompanying drawings illustrate only the various implementations described herein and are not meant to limit the scope of various techniques described herein.

FIGS. 5A and 5B illustrate example sonar images based on sonar return data from shielded and unshielded sonar transducers in accordance with various implementations described herein.

DETAILED DESCRIPTION

Various implementations of example sonar transducer assemblies will now be described in reference to FIGS. 1-5A.

Figure 1:
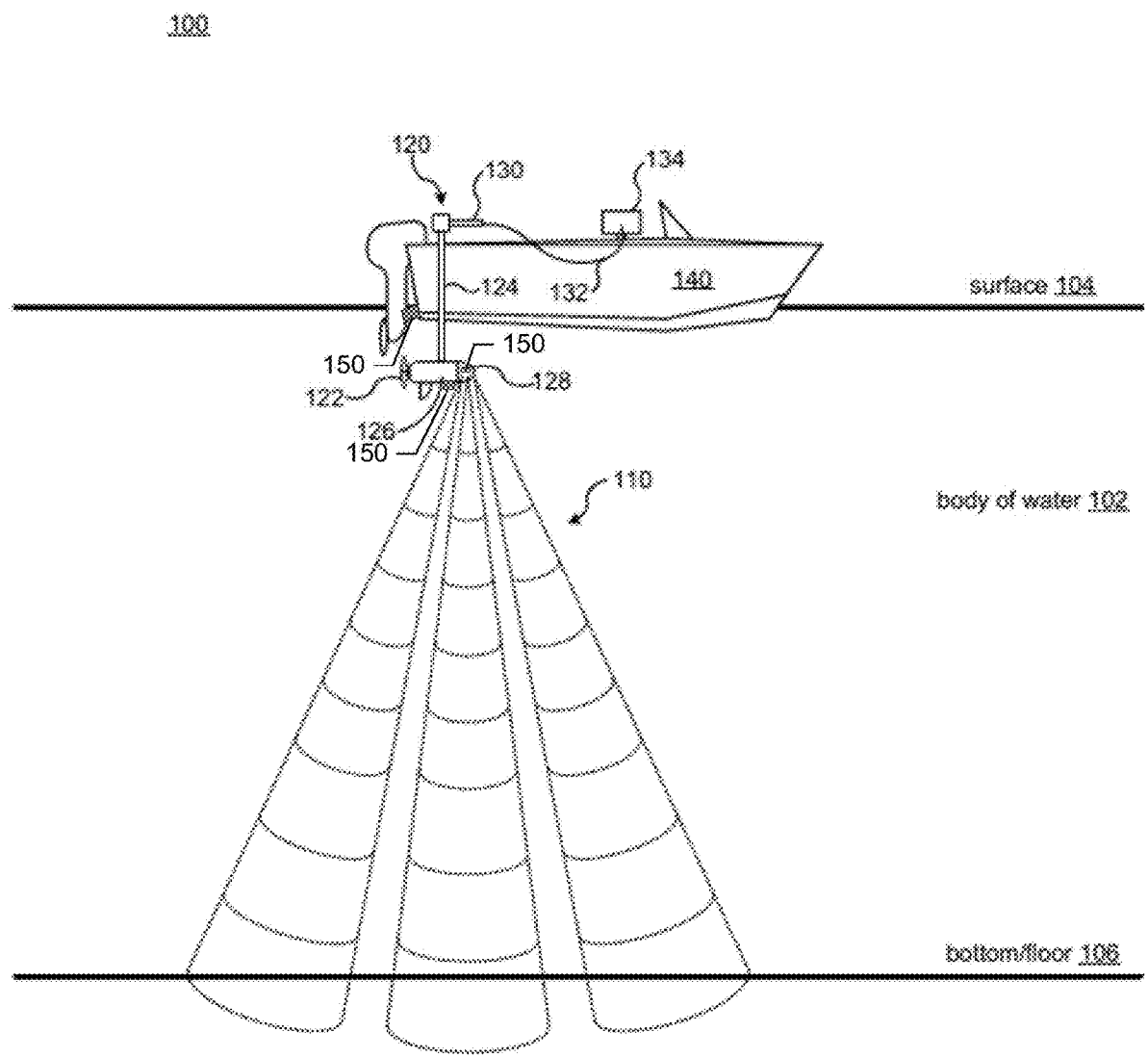
FIG. 1 illustrates a marine environment including a watercraft, in accordance with various implementations described herein.

FIG. 1 illustrates a view of a watercraft 140 that includes a trolling motor 120 in accordance with various implementations described herein.

Figure 2A:
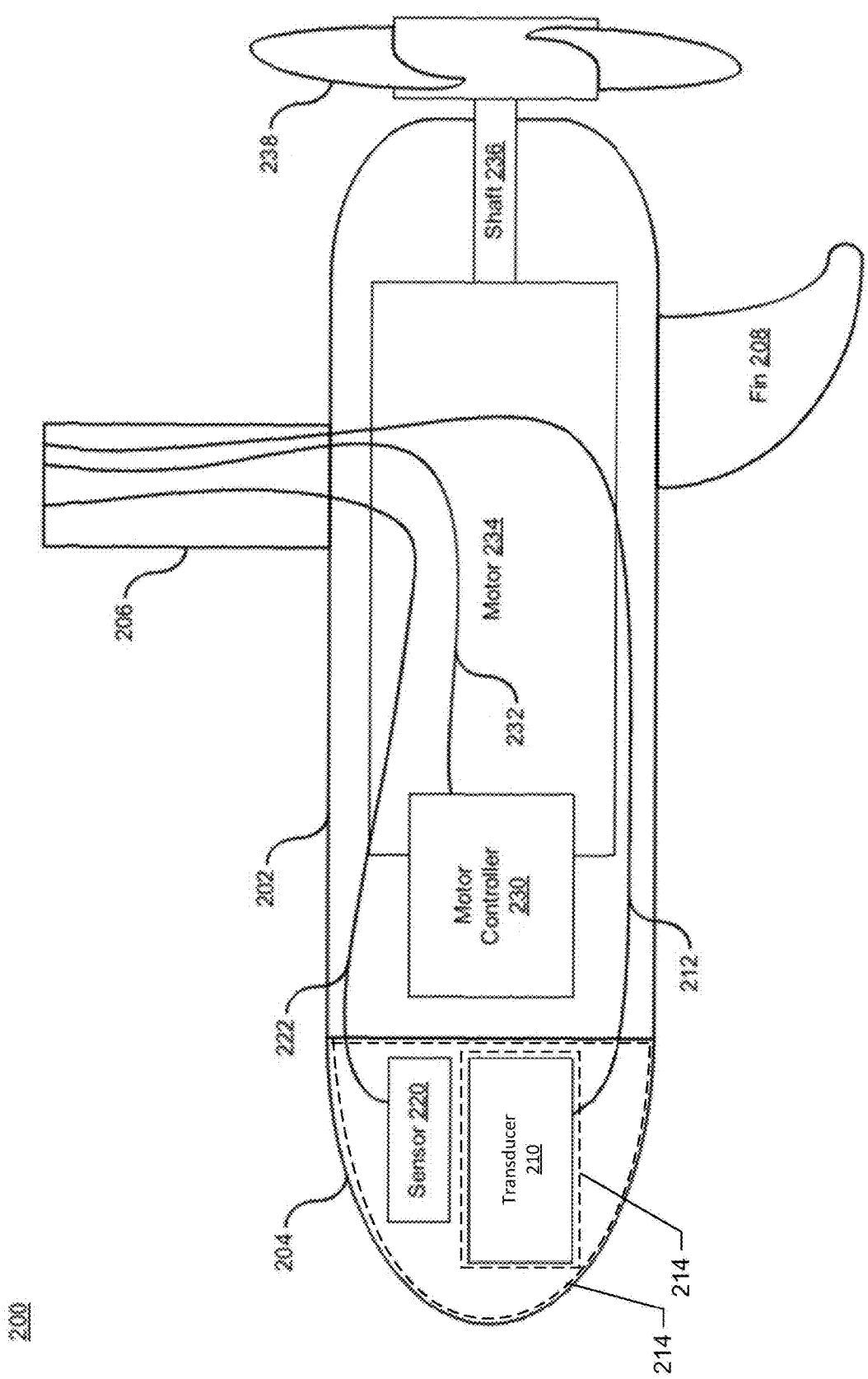
FIGS. 2A, 2B, and 2C illustrate diagrams of trolling motors with sonar transducers in accordance with various implementations described herein.
Figure 2B:
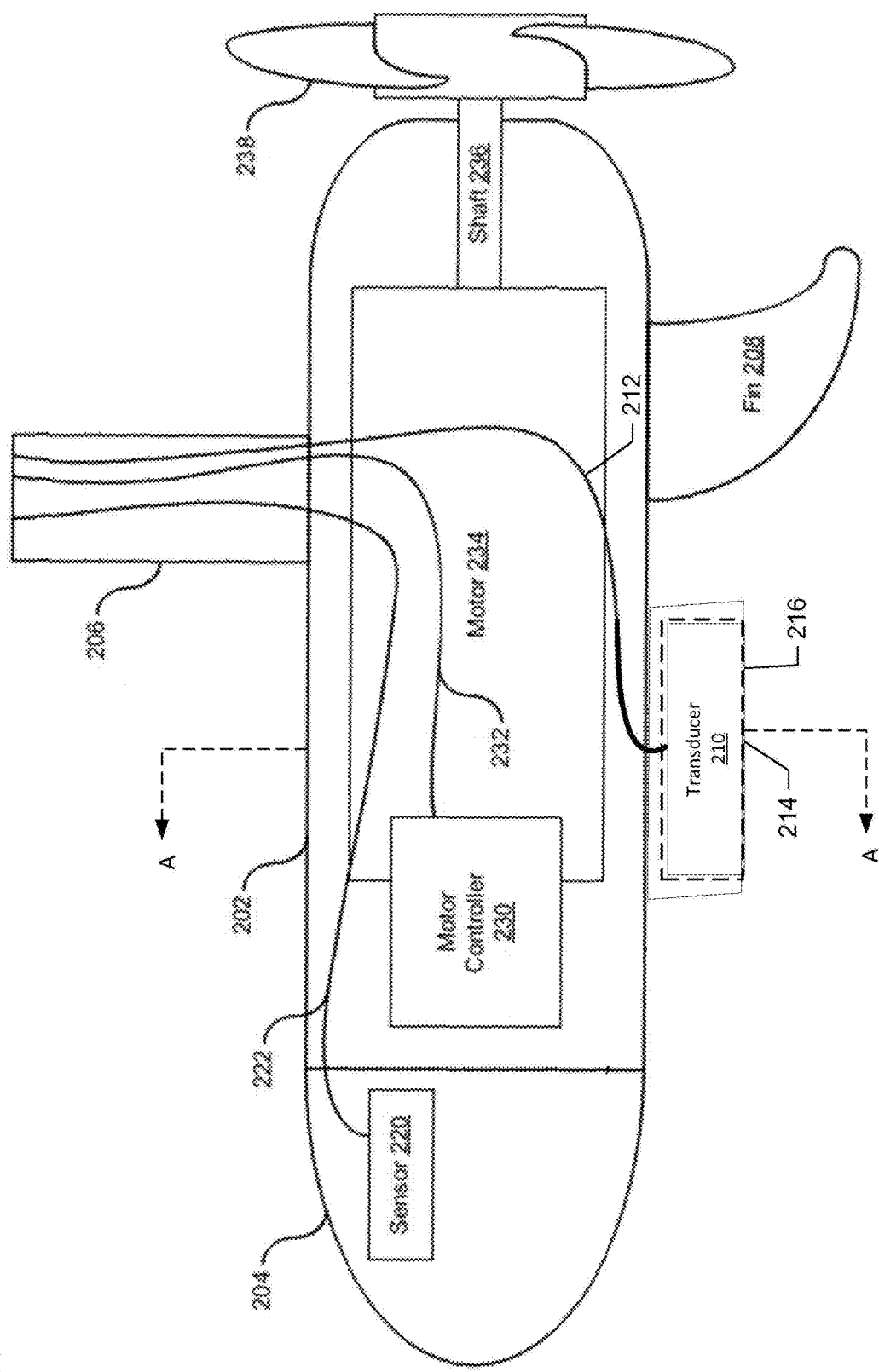

In some implementations, the trolling motor 120 includes a device having a motor (not shown) with a propeller 122 coupled thereto and a shaft 124 coupling the motor to a watercraft 140 (e.g., boat). As shown in FIG. 1, the trolling motor 120 may be coupled or mounted to a stern of the watercraft 140. In some instances, the trolling motor 120 may be coupled or mounted to another part of the watercraft 140, such as, e.g., a bow of the watercraft 140 or some other useful part of the watercraft 140. During operation, the motor is configured to drive the propeller 122 to provide thrust for the watercraft 140 in water, such as a body of water 102. The shaft 124 may be configured to rotate relative to the watercraft 140 to allow steering of the watercraft 140 via user interaction with a handle 130 in the body of water 102 during operation of the motor. In some examples, the trolling motor 120 may include use of a manually operated steering mechanism; however, in other examples, the trolling motor may use a motorized mechanism for steering, which may include use of a cable steer type trolling motor or an electric steer type trolling motor. The trolling motor 120 includes a housing 126 that encapsulates the motor, and the housing 126 in turn, includes a nosecone 128. A transducer assembly, such as depicted in FIGS. 2A and 2B, may be incorporated within the housing 126 or nosecone 128. In some example embodiments, the trolling motor 120 may include a transducer assembly including one or more transducer elements and/or transducer arrays, each of which may be housed within the housing 126 and/or the nosecone 128. The housing 126 may be configured to enclose the motor within a waterproof capsule that is impervious to water. The housing 126 and the nosecone 128 may be formed with a hydrodynamic profile or hydrodynamic contour, such as a torpedo shape.

As shown in FIG. 1, the trolling motor 120 is a stand-alone device that may be coupled to the watercraft 140 and deployed in the body of water 102. The watercraft 140 may be configured to float on a surface 104 of the body of water 102. During operation, the one or more transducer assemblies 150 incorporated within the nosecone 128 and/or the housing 126 may be configured for imaging various environmental features (e.g., fish, plants, rocks, etc.) in the body of water 102. Additionally or alternatively, the transducer assembly 150 may be operably coupled to a hull of the vessel 140, such as on a transom, or to the housing 126 of the trolling motor 120. This imaging may include mapping an underwater environment below the surface 104 of the body of water 102 between the surface 104 and a bottom or floor 106 of the body of water 102. The shaft 124 may be configured to rotate the housing 126 relative to the watercraft 140 via user interaction with the handle 130 to rotate the nosecone 128 (including the incorporated transducer assembly 150) at least 360° for imaging a 360° view of the underwater environment below the surface 104 of the body of water 102.

As shown in FIG. 1, one or more sonar beams 110 may be generated by multiple sonar transducer arrays of the transducer assembly 150 that is incorporated within the nosecone 128 and/or the housing 126 of the trolling motor 120 when deployed in the body of water 102. Each of the transducer arrays may include one or more transducer elements. One example transducer array may be a forward scanning sonar transducer array including spotlight scan transducers that are built-in to the nosecone 128. The spotlight scan transducers may be referred to as forward scanning sonar transducers. In some instances, the transducer assembly may include one or more of a right forward scanning element, a left forward scanning element, a conical sonar element, and/or a bar downscan sonar element, which may be housed inside the nosecone 128 and/or the housing 126.

In some example embodiments the transducer assembly may include a phased transducer array, e.g. a "phased array," which may be housed inside the nosecone 128 or housing 126. The phased array may include a plurality of transducer elements arranged on a PCB. The PCB may mechanically support and electrically connect the electronic components, including the transducer elements using conductive tracks (e.g. traces), pads, and other features. In some embodiments, the conductive tracks may comprise traces etched onto the circuit board. The conductive tracks may comprise sets of traces, for example, each transducer element may be mounted to the PCB such that the transducer element is in electrical communication with a set of traces. For example, the terminals of a transducer element may be soldered or otherwise electrically connected and mechanically secured to one or more pads of a PCB wherein each pad is in electrical communication with a trace etched onto the circuit board. For example, each transducer element may comprise one or more silver-plated terminals or other conductive material-plated terminals. Thus, each transducer element may be in electrical communication with a set of traces comprising the PCB (e.g., via the transducer element terminals). Each transducer element, sub-array, and/or the array of transducer elements may be configured to transmit one or more sonar pulses and/or receive one or more sonar returns.

The transducer arrays or individual transducer elements of the phased array may transmit one or more sonar beams into a body of water with a transmit transducer, a transmit/receive transducer, or similar device. When the sound waves strike anything of differing acoustic impedance (e.g., the sea floor or something suspended in the water above the bottom), the sound waves reflect off that object. These echoes or sonar returns may strike a sonar transducer or a separate sonar receiver element, which converts the echoes back into an electrical signal which is processed by a processor (e.g., sonar signal processor 342 as discussed in reference to FIG. 3) and sent to a display (e.g., an LCD) mounted in the cabin or other convenient location in the boat. This process is often called "sounding". Since the speed of sound in water may be determined by the properties of the water (approximately 4800 feet per second in fresh water), the time lapse between the transmitted signal and the received echoes can be measured and the distance to the objects determined. This process may repeat itself many times per second. The results of many soundings are used to build a picture on the display of the underwater environment. In some embodiments, a more complex array may be used to generate a picture in a single sounding.

In an example embodiment, the transducer assembly may include multiple transducer arrays and/or transducer elements cooperating to receive sonar returns from the underwater environment. The transducer arrays and or transducer elements may be arranged in a predetermined configuration, e.g. relative positions, including known distances between each transducer array or transducer element. The relative positions and known distances between the transducer array or transducer element may be used to resolve an angle associated with the sonar returns (and, for example, a corresponding object in the underwater environment). The respective angles determined by the relative positions and known distances of the transducer arrays or transducer elements may be compared and combined to generate a three-dimensional position of the sonar returns (and, for example, a corresponding object in the underwater environment).

In some example embodiments, the returns from a plurality of the transducer arrays and/or transducer elements may be compared via the process of interferometry to generate one or more angle values. Interferometry may involve determining the angle to a given sonar return via a phase difference between the returns received at two or more transducer arrays and/or transducer elements. In some embodiments, the process of beamforming may be used in conjunction with the plurality of transducer arrays and/or transducer elements to generate one or more angle values associated with each sonar return. Beamforming may involve generating a plurality of receive-beams at predetermined angles by spatially defining the beams based on the relative phasing of the sonar returns and detecting the distance of the sonar returns in each respective beam. Beamforming and interferometry are further described in U.S. patent application Ser. No. 14/717,458, entitled "Sonar Systems using Interferometry and/or Beamforming for 3D Imaging" and U.S. patent application Ser. No. 14/683,573, entitled Systems and Associated Methods for Producing a 3D Sonar Image," both of which are assigned to the Assignee of the present application and are hereby incorporated by reference herein in their entireties.

In some implementations, the transducer arrays and/or transducer elements of the transducer assembly 150 are each capable of generating a separate sonar beam 110. The sonar beams 110 may include, for example, one or more of a conical beam projection and a linear beam projection (though other beam shapes are contemplated). For instance, the sonar beams 110 may include a conical downscan beam projection having a coverage area of a beam produced by a circular downscan transducer. In another instance, the sonar beams 110 may include a linear downscan beam projection having a coverage area of a beam produced by a linear downscan transducer.

In some implementations, the trolling motor 120 may be electrically coupled to a computing device 134 via one or more electrical wires or cables 132 passing through the shaft 124. The computing device 134 may be a marine electronics device (e.g., multi-function display (MFD), smart phone, etc.) for recording sonar data signals received from the transducer array via the electrical cables 132. The computing device 134 may also be configured for controlling operation of the motor via the electrical cables 132. Thus, control signals may be transmitted from the computing device 134 to the motor via the electrical cables 132 for controlling operation of the motor. In some instances, operation of the motor is controlled by the computing device 134 including user interaction with the computing device 134. In some other instances, operation of the motor may be controlled via user interaction with a foot-pedal (not shown) positioned on the watercraft 140.

FIG. 2A illustrates a schematic diagram of a trolling motor 200 in accordance with various implementations described herein. In various implementations, the trolling motor 200 may include and/or incorporate use of various types of electrically and/or mechanically steered trolling motors. In some instances, some trolling motors may be electrically steered via a remote device, foot pedal, or multi-functional display (MFD). In other instances, some trolling motors may be mechanically steered via a handheld tiller type control or a mechanical cable steered foot pedal.

The trolling motor 200 may include a transducer assembly 210, such as including one or more transducer arrays and/or transducer elements. The trolling motor 200 includes a device having a housing 202 configured to encapsulate a motor 234. The housing 202 includes a nosecone 204 and a transducer assembly 210 incorporated within the nosecone 204. The trolling motor 200 includes a propeller 238 coupled to the motor 234 via a drive shaft 236. The trolling motor 200 includes a steering shaft 206 that couples the motor 234 (and housing 202) to a watercraft (e.g., a boat). The motor 234 may include an electric motor, and the motor 234 may be configured to drive the propeller 238 in water to provide thrust for the watercraft in a body of water 102 during operation of the electric motor. The trolling motor 200 may include a fin 208 for stability in water during movement.

In an example embodiment, such as depicted in FIG. 2A, the trolling motor 200 may include a transducer assembly 210, such as disposed in the nosecone 204. In some example embodiments, the trolling motor 200 may include a transducer assembly 210 including multiple transducer arrays and/or transducer elements. The transducer assembly 210 may be disposed within the nosecone 204, within the housing 202, on an external surface of the housing 202, other locations on or in the trolling motor 200, or a combination thereof.

In some example embodiments, one or more of the transducer assemblies 210, such as a phased array, down scanning transducer array, or side scanning transducer array, may be housed in the housing 202. For example, the housing 202 may be shaped to house the transducer assembly 210, such as a hydrodynamic projection 216 from the bottom and/or sides of the housing 202. In some embodiments, the transducer assembly 210 may be disposed within the housing 202 without alteration to the hydrodynamic, e.g. torpedo shape. For example, in an instance in which the transducer assembly 210 is a phased array, there may be sufficient space to house the PCB between the motor 234 and the housing 202 or the circumference of the motor housing may be increased to allow sufficient space to house the transducer assembly 210. Additionally or alternatively, one or more transducer assemblies 210 may be disposed in a sonar housing 216 attached to an external surface of the housing 202 of the trolling motor 200, as depicted in FIG. 2B. For example, the sonar housing 216 may be attached to the housing 202 by cable ties or clamps positioned about the housing 202. To facilitate attachment of the sonar housing 216 to the housing 202 of the trolling motor 200, the sonar housing may include one or more anchors or guides, such as indentions, loops, e.g. apertures, or the like.

In some example embodiments, the trolling motor 200 may also include an electromagnetic field (EMF) damper 214. The EMF damper 214 may be positioned between the motor 234 and electronic components within the housing 202, such as the one or more transducer assemblies 210, the one or more sensors 220, and/or the motor controller 230. The EMF damper 214 may include one or more EMF shielding materials, such as fabrics, textiles, plastics, glass, paints, foils, ribbon, or wire, configured to reduce or prevent electromagnetic interference (EMI) caused by an electromagnetic field produced by the motor 234.

The EMF damper 214 may include a conductive enclosure disposed about at least a portion of the transducer assembly 210. The conductive enclosure may form a Faraday cage, or shield, creating a shielded volume around the transducer assembly 210 that prevents or limits EMI within the shielded volume. The conductive enclosure may be electrically connected to a ground line of an electrical cable 232, 212, 222. The ground line may be connected to a device ground, or preferably earth ground. In an example embodiment, the electrical cable 232, 212, 222 may be a shielded cable, such as a foil shielded cable, a braided shielded cable, a combination of foil and braided shielded cable, or include other suitable cable shielding. The cable shielding may reduce or prevent EMI effects induced on the electrical cables 232, 212, 222. In some embodiments, the cable shielding may serve as the ground line in addition to, or instead of, a ground wire within the electrical cable. The conductive enclosure, e.g. Faraday cage, may be configured to develop an electrical charge in response to the electromagnetic field produced by the motor 234. The electrical charge inducted in the conductive enclosure may be shunted to ground by the ground line. Since the electromagnetic field interacts with the Faraday cage, a shielded volume is created within the Faraday cage, thus preventing, or limiting, the EMI on the transducer array by reducing or eliminating the electromagnetic field within the shielded volume.

The conductive enclosure may be formed from any of a variety of conductive materials, including, but not limited to, metal foil, metal mesh, sheet metal, metal foam, metal ink, wire windings, or the like. One or more of the materials used to form the conductive enclosure may be flexible, such that the conductive enclosure is formable around the transducer array. The conductive materials may be formed from steel, copper, copper alloys, aluminum, silver, or other suitable conductive materials.

In an example embodiment, the conductive enclosure may include an adhesive, such as an epoxy, on at least one side configured to attach the conductive enclosure to the transducer array. The adhesive may be directly applied to the conductive enclosure or may be applied to a transition element, such as double sided tape.

Additionally or alternatively, the conductive enclosure may be formed from a metal particulate. The metal particulate may be, for example, silver, silver-aluminum, silver-copper, silver-glass, nickel-graphite, carbon black, or any other suitable metallic partial. The metal particulate may be suspended in a carrier, such as silicones, polymers, or the like. The carrier may be doped with the metal particulate, such that the conductive enclosure has a desired volume resistivity, such as value between 0.0009-8.0 ohms/cm$^2$. In an example embodiment, the metal particulate may be applied to the internal or external surface of the sonar housing 216. Additionally or alternatively, the sonar housing 216 may be impregnated with the metal particulate, such that the sonar housing 216 forms the conductive enclosure. In an embodiment in which the sonar housing 216 is impregnated with the metal particulate the sonar housing 216 may be formed from the carrier material. Similarly, in embodiments in which the transducer array is disposed in the housing 202 and/or nosecone 204, the metal particulate may be applied to, or impregnated within, portions of the housing 202 and/or nosecone 204 to form the conductive enclosure.

In some example embodiments, the conductive enclosure may cover all, or a majority, of the transducer assembly 210.

Figure 2C:
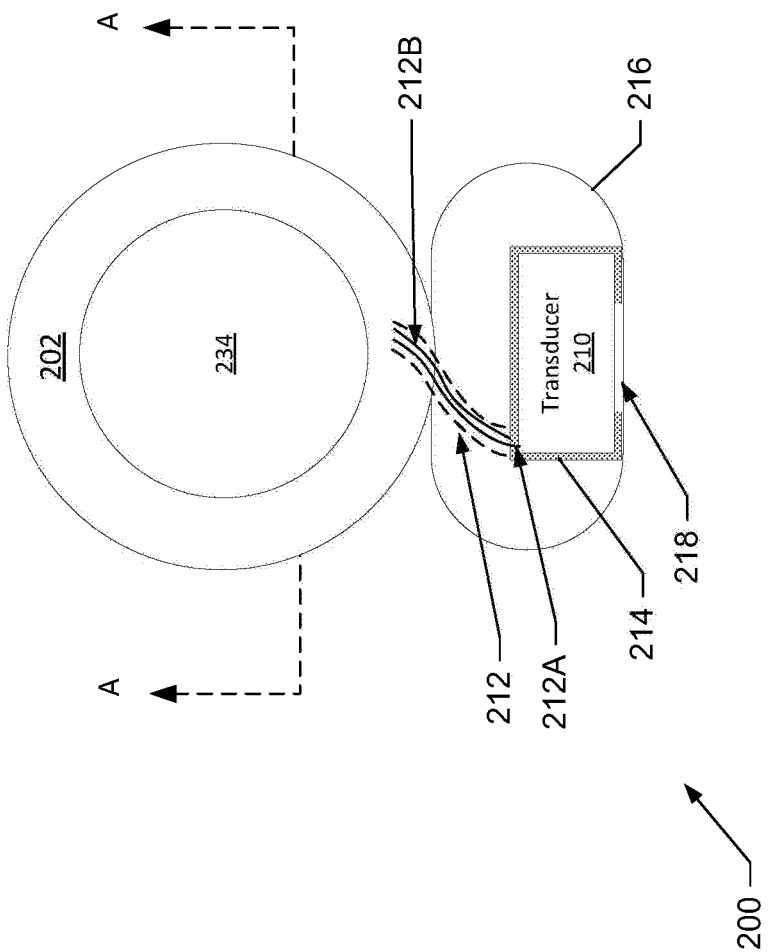

FIG. 2C depicts a cross-sectional view of the trolling motor 200 illustrated in FIG. 2B. In an example embodiment, the EMF damper 214, e.g. conductive enclosure, may include an opening 218 disposed at or proximate an emitting face, or acoustic window, of the transducer assembly 210. The opening 218 may enable the sonar signals to be emitted and sonar returns received by the transducer assembly 210 without acoustic dampening from the EMF damper 214. Since, the conductive enclosure does not require complete coverage of the transducer array 210 to be effective, the opening 218 may cause little or no reduction in the conductive enclosure's reduction of the electromagnetic field within in the shielding volume.

Additionally, FIG. 2C depicts example electrical connections of electrical cable 212 to components of the transducer assembly 210. The electrical cable may include one or more cables 212A electrically connected to the transducer assembly 210 to provide power or data communication with a computing device 134, as in FIG. 1. As discussed above, the electrical cable 212 may also include a ground or drain line 212B. The ground line 212B may be electrically connected, such as by solder, pin connector, or the like, to the EMF damper 214. The electrical connection of the EMF damper 214 to the ground line 212B provides a shunt path for voltage induced in the EMF damper 214, which reduces or eliminates the electromagnetic field within in the shielding volume.

Although discussed in the context of EMI produced by operation of a trolling motor 200, the conductive enclosure, e.g. Faraday cage, may be employed to minimize EMI from any EMI producing device that may operate proximate to the transducer array.

As depicted in FIGS. 5A and 5B, the reduction or elimination of the electromagnetic field within the shielded volume may have a substantial impact on the quality of the sonar images, e.g. reduction in noise, produced based on sonar returns from the transducer assembly 210. FIGS. 5A and 5B each include two rows, the first row (1) depicts sonar images from a non-shielded transducer assembly and the second row (2) depicts sonar images from a shielded transducer assembly.

In FIG. 5A, the transducer assembly and associated computing device may include the following setting configuration 200/800 kHz, 66% sensitivity, 76% color line, 100% contrast, manual mode on, noise rejection off, surface clarity off, and debugging disabled. In FIG. 5B, the transducer assembly and associated computing device may include the following setting configuration 83/455 kHz, 49% sensitivity, 76% color line, 100% contrast, manual mode on, noise rejection off, surface clarity off, and debugging disabled.

Turning to the columns of FIGS. 5A and 5B, the first column (A) depicts a base line sonar image, e.g. without power applied to the trolling motor. The second column (B) depicts a sonar image with power applied to the trolling motor, but not running. The third column (C) depicts a sonar image with the trolling motor running at a low speed. The fourth column (D) depicts a sonar image with the trolling motor transitioning from a low to high speed from the left to right side of the sonar image.

In FIG. 5A, there is no significant difference between the sonar images in columns A-C. However, in the non-shielded sonar image of column D there is a marked increase in noise at a midpoint between the left and right sides of the images. The right half of the sonar image being effectively saturated with noise. In contrast, in the shielded transducer sonar image in column D there is only a small increase in noise on the right half of the sonar image corresponding to the high speed trolling motor operations. As such, at higher sonar frequency operation, the shield provides improved sonar performance when the trolling motor is operating at high speeds.

In FIG. 5B, there is no significant difference between the sonar images in columns A-B. However, in the non-shielded sonar image of column C there is a marked increase in noise at a midpoint between the left and right sides of the images corresponding to the starting of the trolling motor. The right half of the sonar image being effectively saturated with noise. Similarly, the noise saturates all of the sonar image of column D. In contrast, in the shielded transducer sonar image in column C there is only a small increase in noise on the right half of the sonar image corresponding to the low speed trolling motor operations. In the sonar image of column D, the noise increases to saturation only on the right side corresponding to the high speed trolling motor operations. As such, at lower sonar frequency operation, the shield provides improved sonar performance when the trolling motor is operating at low and high speeds.

In view of the data shown with respect to FIGS. 5A and 5B, the shield for the transducer assembly appears to provide varying levels of sonar interference mitigation depending on the speed of the trolling motor and the operating frequency of the sonar transducer.

Turning back to FIGS. 2A and 2B, the steering shaft 206 may incorporate use of a first electrical cable 232 for controlling operation of the motor 234 via a motor controller 230. Operation of the motor 234 may be controlled by a variable power supply, such as a foot-pedal, that provides variable control signals to the motor controller 230, and the motor controller 230 relays the variable control signals to the motor 234 to drive the motor 234. In another instance, operation of the motor 234 may be controlled by an external computing device, such as the computing device 134 in FIG. 1. In this instance, the external computing device may provide variable control signals to the motor controller 230, and the motor controller 230 relays the variable control signals to the motor 234 to drive the motor 234.

The steering shaft 206 may incorporate use of the second electrical cable 212 for transmitting sonar data signals from the transducer assembly 210 to a computing device, such as the computing device 134 in FIG. 1. The transducer assembly 210 may include a spotlight transducer assembly having multiple scanning transducer arrays. The transducer assembly 210 may include multiple transducer arrays including one or more of a right scanning transducer array, left scanning transducer array, a down scanning transducer array, a conical down beam transducer array, and/or a phased array. The sonar data generated and transmitted by the transducer assembly may be used for imaging environmental features in the body of water 102.

Generally, the term sonar (i.e., SOund Navigation And Ranging) refers to various techniques for propagating sound underwater to detect objects on or under a surface of a body of water, such as fish, plants, rocks, sea floor, etc. One type of sonar technology refers to active sonar that is configured to emit pulses of sound waves while receiving echoes, which refers to pinging. Sonar may be used to determine acoustic locations and/or measurements of echo characteristics for targets and objects in a body of water. Further, acoustic frequencies used in sonar based devices may vary from low frequency (i.e., infrasonic) to high frequency (i.e., ultrasonic).

As discussed above, the transducer assembly 210 may include multiple transducer arrays that may be configured to use sonar technology to evaluate attributes of a target object by interpreting echoes from sound waves. In various implementations, each transducer array may be configured to actively generate low and/or high frequency sound waves and evaluate echoes received back to thereby measure time intervals between sending signals and receiving corresponding echoes to determine distance to target objects. Each transducer array may be configured to convert energy into sound waves using piezoelectric transducer elements or capacitive transducer elements that are configured to convert electrical energy into sound. Each piezoelectric transducer element may be configured to use piezoelectric crystals that include a property of changing size when voltage is applied, whereby applying an alternating current (AC) across the piezoelectric crystals may cause oscillations at high frequencies, to thereby generate high frequency sound waves. In some instances, focusing sound waves generated by each piezoelectric transducer element may be determined by an area and shape of each sonar transducer element, a sound wave frequency of each piezoelectric transducer element, and a sound velocity of the propagation medium, such as a body of water. In some instances, each piezoelectric transducer element may use piezoelectric crystals configured as transceivers to transmit and detect sound waves in one or more elements, such as propagating sound waves and receiving echoing sound waves.

The trolling motor 200 may include one or more sensors 220 incorporated within the nosecone 204. Further, the steering shaft 206 may incorporate use of a third electrical cable 222 for transmitting sensor data signals from the one or more sensors 220 to a computing device, such as the computing device 134 in FIG. 1. The one or more sensors 220 may include a dedicated sensor (e.g., water sensor) configured for sensing deployment/removal of the trolling motor 200 in/from the body of water 102. For instance, the dedicated sensor may include electrode terminals (not shown) configured to activate (e.g., power-up) the transducer assembly 210 or transducer array when the trolling motor 200 is deployed in water. The electrode terminals may be configured to deactivate (e.g., power-down) the transducer assembly 210 or transducer array when the trolling motor 200 is removed from water. The one or more sensors 220 may include one or more environmental sensors, such as a temperature sensor. Additionally or alternatively, the one or more sensors 220 may include an orientation or direction sensor.

Figure 3:
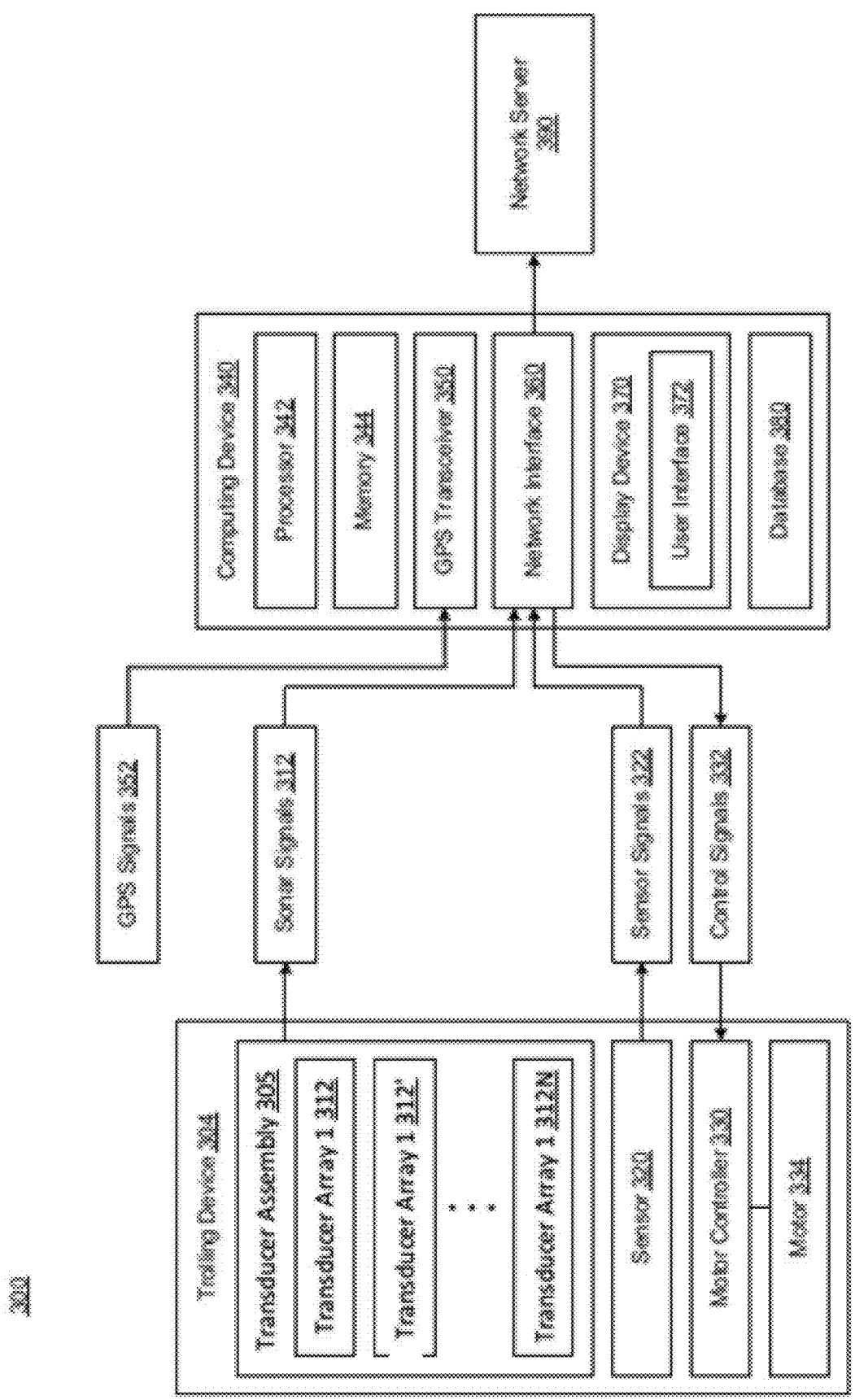
FIG. 3 illustrates a diagram of a transducer system in accordance with various implementations described herein.

FIG. 3 illustrates a block diagram of a transducer system 300 in accordance with implementations of various example embodiments described herein.

The transducer system 300 includes a trolling device 304, a computing device 340, and a network server 390. The trolling device 304 and the computing device 340 are coupled to a watercraft, e.g., boat. The trolling device 304 may be a trolling motor, and the computing device 340 may be a marine electronics device, a multi-function display (MFD), a smart phone, etc.

The trolling device 304 includes a transducer assembly 305. The transducer assembly 305 may include multiple transducer arrays 312, 312', . . . , 312N, which may include one or more of a right scanning transducer array, a left scanning transducer array, a down scanning transducer array (e.g., bar or linear downscan transducer array), a conical down beam transducer array, and a phased array. As discussed above, each of the transducer arrays 312 may include one or more transducer elements. The trolling device 304 includes one or more sensors 320. The one or more sensors 320 may include one or more environmental sensors, such as a water sensor, temperature sensor, or an orientation sensor. The trolling device 304 includes a motor 334 controlled with a motor controller 330.

The computing device 340 includes a processor 342 and memory 344 including instructions that cause the processor 342 to process and record sonar data associated with sonar signals 312 received from the transducer assembly 305 via a network interface 360. The instructions may further cause the processor 342 to process and record sensor data associated with sensor signals 322 received from the one or more sensors 320 via the network interface 360. The instructions may further cause the processor 342 to generate control signals 332 for controlling operation of the motor 334 via the motor controller 330 and the network interface 360.

The computing device 340 may include a global positioning system (GPS) transceiver 350 configured to receive GPS signals 352 from a global positioning satellite system, relay antenna, or the like. The memory 344 may include instructions that cause the processor 342 associate GPS data (related to the GPS signals 352) with the sonar data (related to the sonar signals 312) received from the transducer array 310.

In some examples, the computing device 340 may be configured to upload data (e.g., sonar data, sensor data, GPS data, etc.) to a network server 390 (e.g., cloud server) via the network interface 360. The network server 390 may include memory and/or at least one database on a network (e.g., cloud based network). Further, the computing device 340 may be configured to receive and associate geo-coordinate data, such as the GPS data, to sonar data and/or sensor data at any time, including prior to upload. The network may include various types of communication networks and/or cloud based networks, including wired networks and/or wireless networks.

The computing device 340 may be configured as a special purpose machine for interfacing with the trolling device 304, including the transducer assembly 305 and each of the transducer arrays 312, 312', . . . , 312N. The computing device 304 may include standard elements and/or components, including the processor 342, memory 344 (e.g., non-transitory computer-readable storage medium), at least one database 380, power, peripherals, and various other computing elements and/or components that may not be specifically shown in FIG. 3. The computing device 340 may include a display device 370 (e.g., a monitor or other display) that may be used to provide a user interface (UI) 372, including a graphical user interface (GUI). The display 370 may be incorporated as part of the computing device 340 or may be a separate component. The UI 372 may be used to receive preferences and/or input controls from a user of the display device 370 for managing and/or utilizing the system 300, such as interfacing with the trolling device 304 and the transducer array 304 and controlling operation of the motor 334 via the motor controller 330. Various other elements and/or components of the system 300 that may be useful for the purpose of implementing the system 300 may be added, included, and/or interchanged, in manner as described herein.

Computing System

Implementations of various technologies described herein may be operational with numerous general purpose or special purpose computing system environments or configurations. Examples of well-known computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Generally, program modules include routines, programs, objects, components, data structures, etc. that performs particular tasks or implement particular abstract data types. Further, each program module may be implemented in its own way, and all need not be implemented the same way. While program modules may all execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or both.

The various technologies described herein may be implemented in the context of marine electronics, such as devices found in marine vessels and/or navigation systems. Ship instruments and equipment may be connected to the computing systems described herein for executing one or more navigation technologies. The computing systems may be configured to operate using various radio frequency technologies and implementations, such as sonar, radar, GPS, and like technologies.

The various technologies described herein may also be implemented in distributed computing environments where tasks are performed by remote processing devices that are linked through a communications network, e.g., by hardwired links, wireless links, or combinations thereof. In a distributed computing environment, program modules may be located in both local and remote computer storage media including memory storage devices.

Marine Electronics Device

Figure 4:
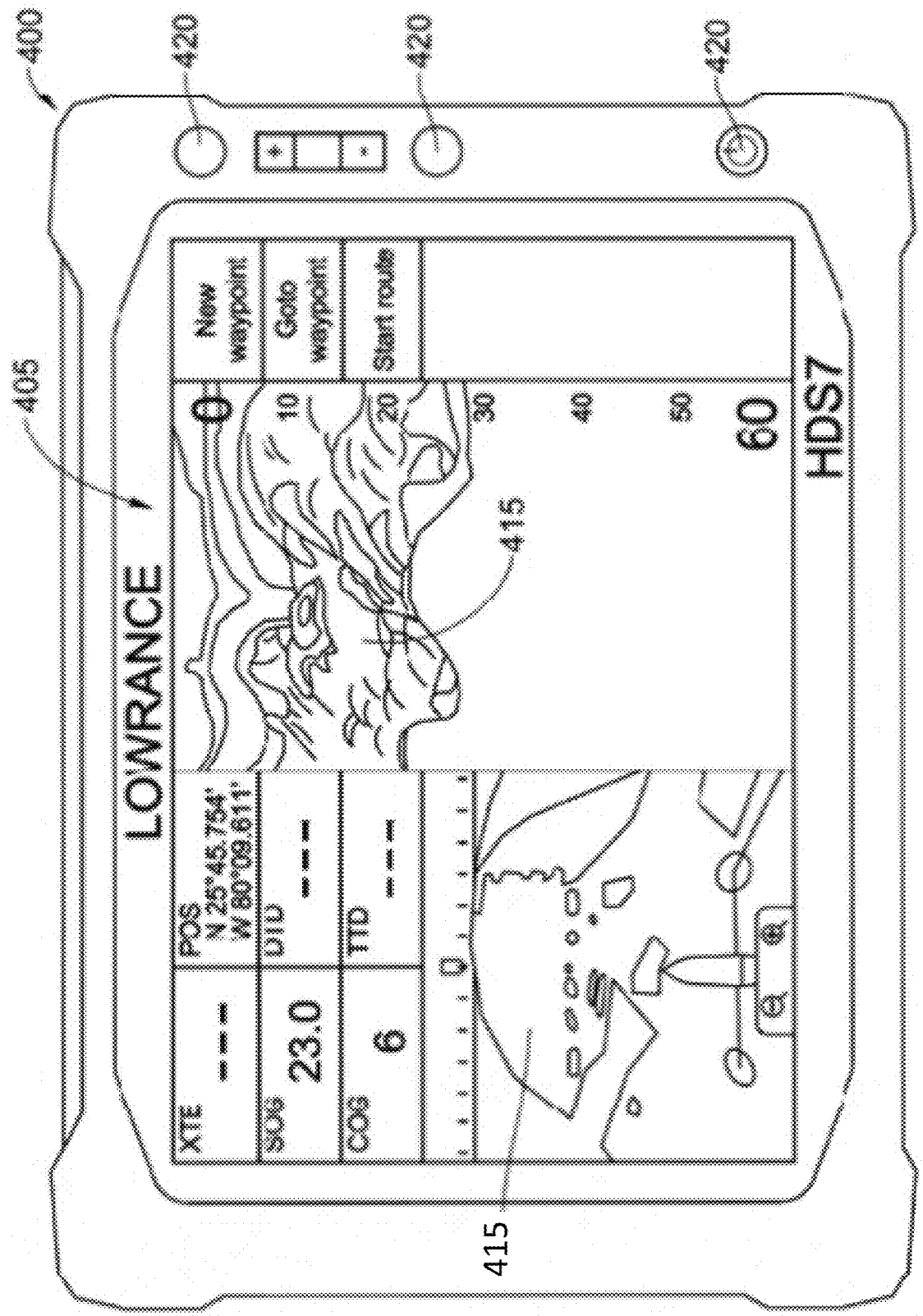
FIG. 4 illustrates a schematic of a marine electronics device in accordance with various implementations described herein.

FIG. 4 illustrates an example schematic of a marine electronics device 400 in accordance with implementations of various techniques described herein. The marine electronics device 400 includes a screen 405. In certain implementations, the screen 405 may be sensitive to touching by a finger. In other implementations, the screen 405 may be sensitive to the body heat from the finger, a stylus, or responsive to a mouse. The marine electronics device 400 may be attached to a National Marine Electronics Association (NMEA) bus or network. The marine electronics device 400 may send or receive data to or from another device attached to the NMEA 2000 bus. For example, the marine electronics device 400 may transmit commands and receive data from a motor or a sensor using an NMEA 2000 bus. In one implementation, the marine electronics device 400 may be capable of steering a vessel and controlling the speed of the vessel, i.e., autopilot. For example, one or more waypoints may be input to the marine electronics device 400, and the marine electronics device 400 may steer a vessel to the one or more waypoints. The marine electronics device 400 may transmit or receive NMEA 2000 compliant messages, messages in a proprietary format that do not interfere with NMEA 2000 compliant messages or devices, or messages in any other format. In various implementations, the marine electronics device 400 may be attached to various other communication buses and/or networks configured to use various other types of protocols that may be accessed via, e.g., NMEA 2000, NMEA 0183, Ethernet, Proprietary wired protocol, etc. In some implementations, the marine electronics device 400 may communicate with other devices on the vessel via wireless communication protocols.

The marine electronics device 400 may be operational with numerous general purpose or special purpose computing system environments or configurations. The marine electronics device 400 may include any type of electrical and/or electronics device capable of processing data and information via a computing system. The marine electronics device 400 may include a marine instrument, such that the marine electronics device 400 may use the computing system to display and/or process the one or more types of marine electronics data. The marine electronics device 400 may be configured to display marine electronic data 415, such as, e.g., chart data, radar data, sonar data, steering data, dashboard data, navigation data, fishing data, engine data, and the like. Further, the marine electronics device 400 may also include one or more buttons 420 that may include either physical buttons or virtual buttons, or a combination thereof. Still further, the marine electronics device 400 may receive input through a screen 405 sensitive to touch or buttons 420.

The computing system may include a central processing unit (CPU), a system memory, a graphics processing unit (GPU), and a system bus that couples various system components including the system memory to the CPU. The computing system may include one or more CPUs, which may include a microprocessor, a microcontroller, a processor, a programmable integrated circuit, or a combination thereof. The CPU may include an off-the-shelf processor such as a Reduced Instruction Set Computer (RISC), or a Microprocessor without Interlocked Pipeline Stages (MIPS) processor, or a combination thereof. The CPU may also include a proprietary processor.

The GPU may be a microprocessor specifically designed to manipulate and implement computer graphics. The CPU may offload work to the GPU. The GPU may have its own graphics memory, and/or may have access to a portion of the system memory. As with the CPU, the GPU may include one or more processing units, and each processing unit may include one or more cores.

The CPU may provide output data to a GPU. The GPU may generate graphical user interfaces that present the output data. The GPU may also provide objects, such as menus, in the graphical user interface. A user may provide inputs by interacting with the objects. The GPU may receive the inputs from interaction with the objects and provide the inputs to the CPU. A video adapter may be provided to convert graphical data into signals for a monitor (MFD 400). The monitor (MFD 400) includes a screen 405. In certain implementations, the screen 405 may be sensitive to touching by a finger. In other implementations, the screen 405 may be sensitive to the body heat from the finger, a stylus, or responsive to a mouse.

The system bus may be any of several types of bus structures, including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus. The system memory may include a read only memory (ROM) and a random access memory (RAM). A basic input/output system (BIOS), containing the basic routines that help transfer information between elements within the computing system, such as during start-up, may be stored in the ROM.

The computing system may further include a hard disk drive interface for reading from and writing to a hard disk, a memory card reader for reading from and writing to a removable memory card, and an optical disk drive for reading from and writing to a removable optical disk, such as a CD ROM or other optical media. The hard disk, the memory card reader, and the optical disk drive may be connected to the system bus by a hard disk drive interface, a memory card reader interface, and an optical drive interface, respectively. The drives and their associated computer-readable media may provide nonvolatile storage of computer-readable instructions, data structures, program modules and other data for the computing system.

Although the computing system is described herein as having a hard disk, a removable memory card and a removable optical disk, it should be appreciated by those skilled in the art that the computing system may also include other types of computer-readable media that may be accessed by a computer. For example, such computer-readable media may include computer storage media and communication media. Computer storage media may include volatile and non-volatile, and removable and non-removable media implemented in any method or technology for storage of information, such as computer-readable instructions, data structures, program modules, software modules, or other data. Computer-readable storage media may include non-transitory computer-readable storage media. Computer storage media may further include RAM, ROM, erasable programmable read-only memory (EPROM), electrically erasable programmable read-only memory (EEPROM), flash memory or other solid state memory technology, CD-ROM, digital versatile disks (DVD), or other optical storage, magnetic cassettes, magnetic tape, magnetic disk storage or other magnetic storage devices, or any other medium which can be used to store the desired information and which can be accessed by the computing system. Communication media may embody computer readable instructions, data structures, program modules or other data in a modulated data signal, such as a carrier wave or other transport mechanism and may include any information delivery media. The term "modulated data signal" may mean a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR), and other wireless media. The computing system may include a host adapter that connects to a storage device via a small computer system interface (SCSI) bus, Fiber Channel bus, eSATA bus, or using any other applicable computer bus interface.

The computing system can also be connected to a router to establish a wide area network (WAN) with one or more remote computers. The router may be connected to the system bus via a network interface. The remote computers can also include hard disks that store application programs. In another implementation, the computing system may also connect to the remote computers via local area network (LAN) or the WAN. When using a LAN networking environment, the computing system may be connected to the LAN through the network interface or adapter. The LAN may be implemented via a wired connection or a wireless connection. The LAN may be implemented using Wi-Fi™ technology, cellular technology, Bluetooth™ technology, satellite technology, or any other implementation known to those skilled in the art. The network interface may also utilize remote access technologies (e.g., Remote Access Service (RAS), Virtual Private Networking (VPN), Secure Socket Layer (SSL), Layer 2 Tunneling (L2T), or any other suitable protocol). In some examples, these remote access technologies may be implemented in connection with the remote computers. It will be appreciated that the network connections shown are exemplary and other means of establishing a communications link between the computer systems may be used.

A number of program modules may be stored on the hard disk, memory card, optical disk, ROM or RAM, including an operating system, one or more application programs, and program data. In certain implementations, the hard disk may store a database system. The database system could include, for example, recorded points. The application programs may include various mobile applications ("apps") and other applications configured to perform various methods and techniques described herein. The operating system may be any suitable operating system that may control the operation of a networked personal or server computer.

A user may enter commands and information into the computing system through input devices such as buttons, which may be physical buttons, virtual buttons, or combinations thereof. Other input devices may include a microphone, a mouse, or the like (not shown). These and other input devices may be connected to the CPU through a serial port interface coupled to system bus, but may be connected by other interfaces, such as a parallel port, game port or a universal serial bus (USB).

Certain implementations may be configured to be connected to a global positioning system (GPS) receiver system and/or a marine electronics system. The GPS system and/or marine electronics system may be connected via the network interface. The GPS receiver system may be used to determine position data for the vessel on which the marine electronics device 400 is disposed. The GPS receiver system may then transmit the position data to the marine electronics device 400. In other examples, any positioning system known to those skilled in the art may be used to determine and/or provide the position data for the marine electronics device 400.

The marine electronics system may include one or more components disposed at various locations on the vessel. Such components may include one or more data modules, sensors, instrumentation, and/or any other devices known to those skilled in the art that may transmit various types of data to the marine electronics device 400 for processing and/or display. The various types of data transmitted to the marine electronics device 400 from the marine electronics system may include marine electronics data and/or other data types known to those skilled in the art. The marine electronics data received from the marine electronics system may include chart data, sonar data, structure data, radar data, navigation data, position data, heading data, automatic identification system (AIS) data, Doppler data, speed data, course data, or any other type known to those skilled in the art.

In one implementation, the marine electronics system may include a radar sensor for recording the radar data and/or the Doppler data, a compass heading sensor for recording the heading data, and a position sensor for recording the position data. In a further implementation, the marine electronics system may include a sonar transducer for recording the sonar data, an AIS transponder for recording the AIS data, a paddlewheel sensor for recording the speed data, and/or the like.

The marine electronics device 400 may receive external data via the LAN or the WAN. In one implementation, the external data may relate to information not available from the marine electronics system. The external data may be retrieved from the Internet or any other source. The external data may include atmospheric temperature, tidal data, weather, moon phase, sunrise, sunset, water levels, historic fishing data, and other fishing data.

In one implementation, the marine electronics device 400 may be a multi-function display (MFD) unit, such that the marine electronics device 400 may be capable of displaying and/or processing multiple types of marine electronics data. FIG. 4 illustrates a schematic diagram of an MFD unit in accordance with implementations of various techniques described herein. In particular, the MFD unit may include the computing system, the monitor (MFD 400), the screen 405, and the buttons such that they may be integrated into a single console.

The discussion of the present disclosure is directed to certain specific implementations. It should be understood that the discussion of the present disclosure is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of the implementations and combinations of elements of different implementations within the scope of the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort maybe complex and time consuming, but would nevertheless be a routine undertaking of design, fabrication, and manufacture for those of ordinary skill having benefit of this disclosure. Nothing in this application should be considered critical or essential to the claimed subject matter unless explicitly indicated as being "critical" or "essential."

Reference has been made in detail to various implementations, examples of which are illustrated in the accompanying drawings and figures. In the following detailed description, numerous specific details are set forth to provide a thorough understanding of the present disclosure. However, the present disclosure may be practiced without these specific details. In other instances, well-known methods, procedures, components, circuits and networks have not been described in detail so as not to unnecessarily obscure aspects of the embodiments.

It should also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step, without departing from the scope of the invention. The first object or step, and the second object or step, are both objects or steps, respectively, but they are not to be considered the same object or step.

The terminology used in the description of the present disclosure herein is for the purpose of describing particular implementations and is not intended to limit the present disclosure. As used in the description of the present disclosure and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. As used herein, the terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised without departing from the basic scope thereof, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device comprising:
   a motor;
   a propeller coupled to the motor;
   a shaft configured to couple the motor to a watercraft, wherein the shaft is configured to rotate relative to the watercraft, wherein the shaft defines an internal passage;
   a transducer configured to transmit one or more sonar beams into an underwater environment;
   a housing that holds the motor and the transducer;
   at least one electrical cable that leads from the transducer through the internal passage of the shaft to enable electrical signals to be transmitted between the transducer and a computing device, wherein the electrical cable is contained within the internal passage of the shaft so as to protect the electrical cable while still enabling rotation of the shaft and housing; and
   a conductive enclosure disposed around at least a portion of the transducer and positioned between the transducer and the motor, wherein the conductive enclosure is electrically connected to a ground line to create a shielded volume, wherein the conductive enclosure reduces an electromagnetic field within the shielded volume, wherein the conductive enclosure includes a metal particulate that is either applied to a surface within the housing or impregnated into the surface within the housing.

2. The device of claim 1, wherein the surface within the housing is within a nosecone, and wherein the transducer is disposed in the nosecone.

3. The device of claim 1, wherein the motor comprises an electric motor, wherein the electric motor is configured to drive the propeller to provide thrust for the watercraft in a body of water during operation of the electric motor.

4. The device of claim 1, wherein the housing encloses the motor and the transducer within a waterproof capsule impervious to water.

5. The device of claim 1, wherein the at least one electrical cable comprises a shielded electrical cable.

6. The device of claim 1, wherein the conductive enclosure comprises copper or nickel.

7. A sonar transducer assembly comprising:
   a transducer configured to transmit one or more sonar beams into an underwater environment;
   a housing that holds the transducer;
   at least one electrical cable that enables electrical signals to be transmitted between the transducer and a computing device; and
   a conductive enclosure disposed around at least a portion of the transducer and electrically connected to a ground line to create a shielded volume, wherein the conductive enclosure reduces an electromagnetic field within the shielded volume, wherein the conductive enclosure includes a metal particulate that is either applied to a surface within the housing or impregnated into the surface within the housing.

8. The sonar transducer assembly of claim 7, wherein the conductive enclosure comprises an opening such that an emitting face of the transducer is unobstructed by the conductive enclosure.

9. The sonar transducer assembly of claim 7, wherein the at least one electrical cable comprises a shielded electrical cable.

10. The sonar transducer assembly of claim 7, wherein the housing is configured to be attached to a trolling motor, and wherein, when the housing is attached to the trolling motor, the conductive enclosure reduces an electromagnetic field produced by operation of the trolling motor.

11. A sonar transducer assembly comprising:
- a transducer configured to transmit one or more sonar beams into an underwater environment;
- a housing that holds the transducer, wherein the housing is configured to be coupled to a motor housing of a trolling motor;
- at least one electrical cable that enables electrical signals to be transmitted between the transducer and a computing device; and a conductive enclosure disposed around at least a portion of the transducer and electrically connected to a ground line to create a shielded volume, wherein the conductive enclosure reduces an electromagnetic field within the shielded volume, wherein the conductive enclosure includes a metal particulate that is either applied to a surface of the housing or impregnated into the surface of the housing.

* * * * *